US006922372B2

United States Patent
Suzuki

(10) Patent No.: US 6,922,372 B2
(45) Date of Patent: Jul. 26, 2005

(54) SYNCHRONOUS SEMICONDUCTOR MEMORY DEVICE HAVING STABLE DATA OUTPUT TIMING

(75) Inventor: Takanobu Suzuki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/890,251

(22) Filed: Jul. 14, 2004

(65) Prior Publication Data

US 2005/0013178 A1 Jan. 20, 2005

(30) Foreign Application Priority Data

Jul. 17, 2003 (JP) ........................................ 2003-276107

(51) Int. Cl.[7] ................................................ G11C 8/00
(52) U.S. Cl. .................. 365/233; 365/189.05; 365/194
(58) Field of Search ............................ 365/233, 189.04, 365/194, 189.05, 189.08

(56) References Cited

U.S. PATENT DOCUMENTS 6,301,191 B1 * 10/2001 Ooishi ........................ 365/233

6,333,892 B2 * 12/2001 Hamamoto et al. ..... 365/230.08

FOREIGN PATENT DOCUMENTS

| JP | 10-308096 | 11/1998 |
| JP | 2003-085974 | 3/2003 |

* cited by examiner

*Primary Examiner*—Richard Elms
*Assistant Examiner*—Hien Nguyen
(74) *Attorney, Agent, or Firm*—McDermott Will & Emery LLP

(57) ABSTRACT

In a delay adjusting unit arranged in a clock delay adjusting circuit, when a drive power switch signal is at an "H" level, a transfer gate is closed, and an input signal is delayed by a delay amount of the delay unit. When drive power switch signal is at the "L" level, the transfer gate is closed, and the input signal is output without being delayed. When the current drive power of an output buffer is low, the drive power switch signal at the "L" level decreases the delay amount of an output clock signal. When the current drive power is high, the drive power switch signal at the "H" level increases the delay amount of the output clock signal.

6 Claims, 10 Drawing Sheets

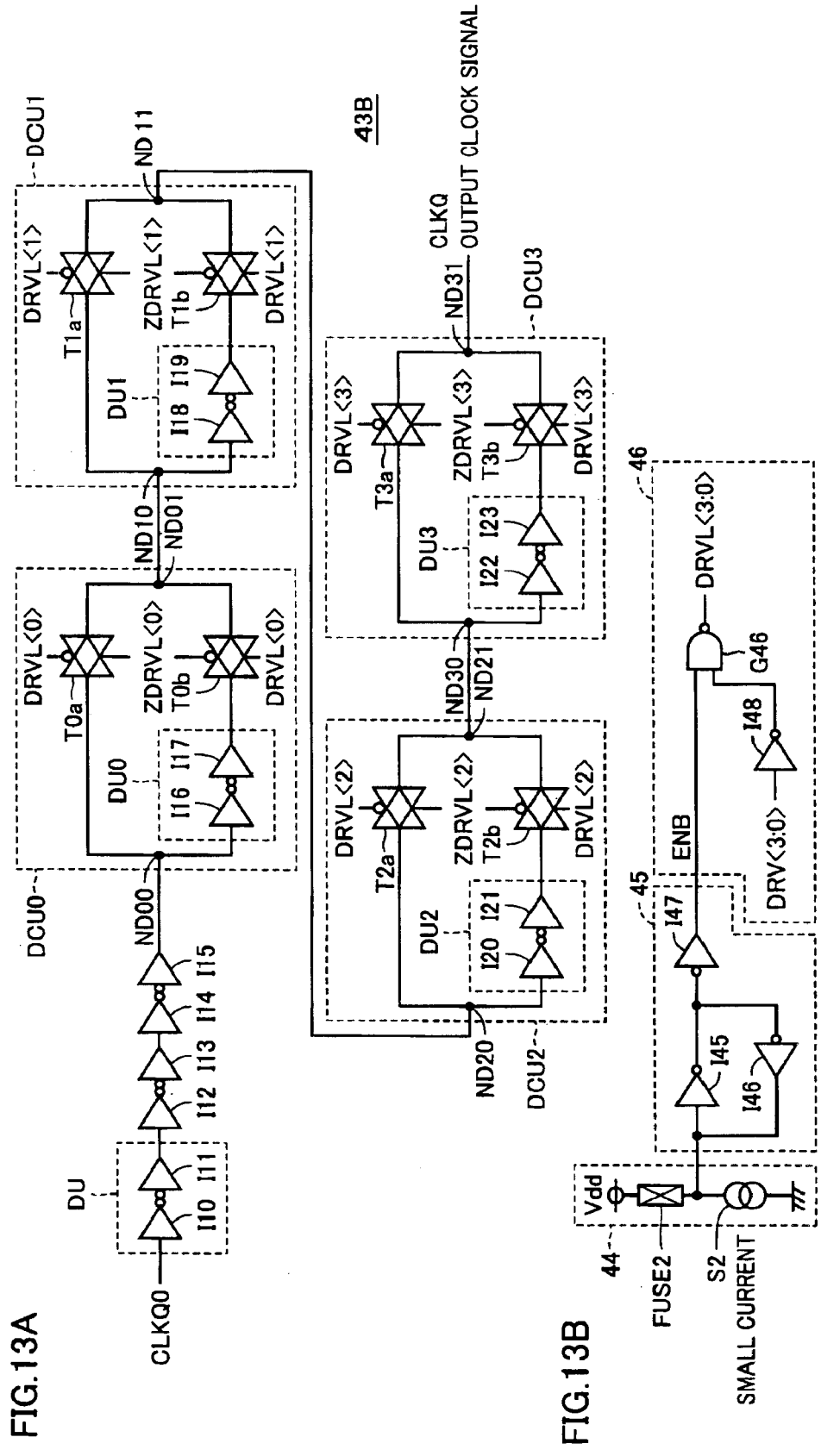

SYNCHRONOUS SEMICONDUCTOR MEMORY DEVICE HAVING STABLE DATA OUTPUT TIMING

BACKGROUND OF THE INVENTION

1. Field of the Invention

The present invention relates to a semiconductor-memory device, and particularly to output timing of a data signal of synchronous semiconductor memory device.

2. Description of the Background Art

In accordance with remarkable increase in operation speed of CPUs (Central Processing Units), it has been strongly required to increase operation speeds of main storage devices. Therefore, SDRAMs (Synchronous Dynamic Random Access Memories), which can perform fast data input/output operations in synchronization with an external clock signal, have been developed and used.

In general, the SDRAM internally includes a clock generating circuit, which generates an internal clock signal synchronized with an external clock signal, and internal circuits of the SDRAM are controlled based on the internal clock signal. The clock generating circuit is formed of a DLL (Delay Locked Loop) circuit or the like, and generates the internal clock signal delayed by a predetermined amount with respect to the external clock signal.

In the operation of externally transmitting data signals to or from the SDRAM, therefore, the internal clock signal having the predetermined delay amount is used for controlling data output timing of an output buffer, which controls output of the data signals.

In the SDRAM having a high operation frequency for achieving fast data transfer, an output buffer driving an output load, which is formed of downstream circuits or the like receiving the data signal, is configured to have a large current drive power. Such a current drive power is set by increasing transistor sizes of transistors forming the output buffer.

However, if the operation frequency is low, the large current drive power of the output buffer causes excessive charging/discharging of the output load. This results in rapid change in voltage, and causes overshoot or undershoot. In this case, therefore, the transistor sizes of transistors in the output buffer are reduced to suppress the current drive power, as disclosed, e.g., in Japanese Patent Laying-Open Nos. 10-308096 and 2003-085974.

Although the current drive power of the output buffer is adjusted in accordance with the operation frequency as described above, the internal clock determining the data output timing is always controlled to have a constant delay amount by the clock generating circuit.

Therefore, if the current drive power of the output buffer is large with respect to a constant output load, a voltage on an output node changes rapidly, and the data output timing can be accurately synchronized with the internal clock signal. Meanwhile, if the current drive power of the output buffer is small, the voltage on the output node changes slowly, and the data output timing is shifted from the internal clock signal.

A time from activation of the external clock signal to output of data from a main storage device is referred to as an operation delay time (access time) of a memory core arranged in a microprocessor or the like, and is usually defined in a data sheet as a specification item representing an operation speed. Therefore, if the access time changes due to adjustment of the drive power of the output buffer, this impairs the reliability of products.

SUMMARY OF THE INVENTION

An object of the invention is to provide a semiconductor memory device, which can hold stable data output timing independently of adjustment of the current drive power in the output buffer.

According to the invention, a semiconductor memory device for performing input/output of data in synchronization with an external clock signal, includes a memory cell array having a plurality of memory cells arranged in rows and columns; a clock generating circuit generating an internal clock signal by delaying the external clock signal by a predetermined delay amount; and a data output circuit providing a data signal read from the memory cell array to an output node in synchronization with the internal clock signal. The data output circuit includes a plurality of first current drive portions coupled in parallel between a voltage corresponding to a first level and the output node, and each having a control node; a plurality of second current drive portions coupled in parallel between a voltage corresponding to a second level and said output node, and each having a control node; and a portion producing a drive power switch signal controlling a current drive power applied the output node at an intended level. Each of the plurality of first current drive portions forms a current path between the voltage corresponding to the first level and the output node in accordance with the drive power switch signal received on the corresponding control node. Each of the plurality of second current drive portions forms a current path between the voltage corresponding to the second level and the output node in accordance with the drive power switch signal received on the corresponding control node. The clock generating circuit includes a delay circuit producing the internal clock signal by delaying the external clock signal by the predetermined delay amount, and a delay adjusting circuit determining the delay amount of the delay circuit in accordance with the drive power switch signal.

According to the semiconductor memory device of the invention, when a current drive power of an output driver transistor is changed in the output buffer of the synchronous semiconductor memory device, timing of activation of the output driver transistor is adjusted in accordance with the current drive power so that the data output timing can be kept constant.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13A shows a structure of a clock delay adjusting circuit 43B included in clock buffer 40 of a synchronous semiconductor memory device according to a second embodiment of the invention. FIG. 13B shows a structure of a portion generating drive power switch select signals DRVL<3:0>.

DESCRIPTION OF THE PREFERRED EMBODIMENTS

Embodiments of the invention will now be described with reference to the drawings. In the following description, the same or corresponding portions bear the same reference numbers, and description thereof is not repeated.

First Embodiment

Figure 1:
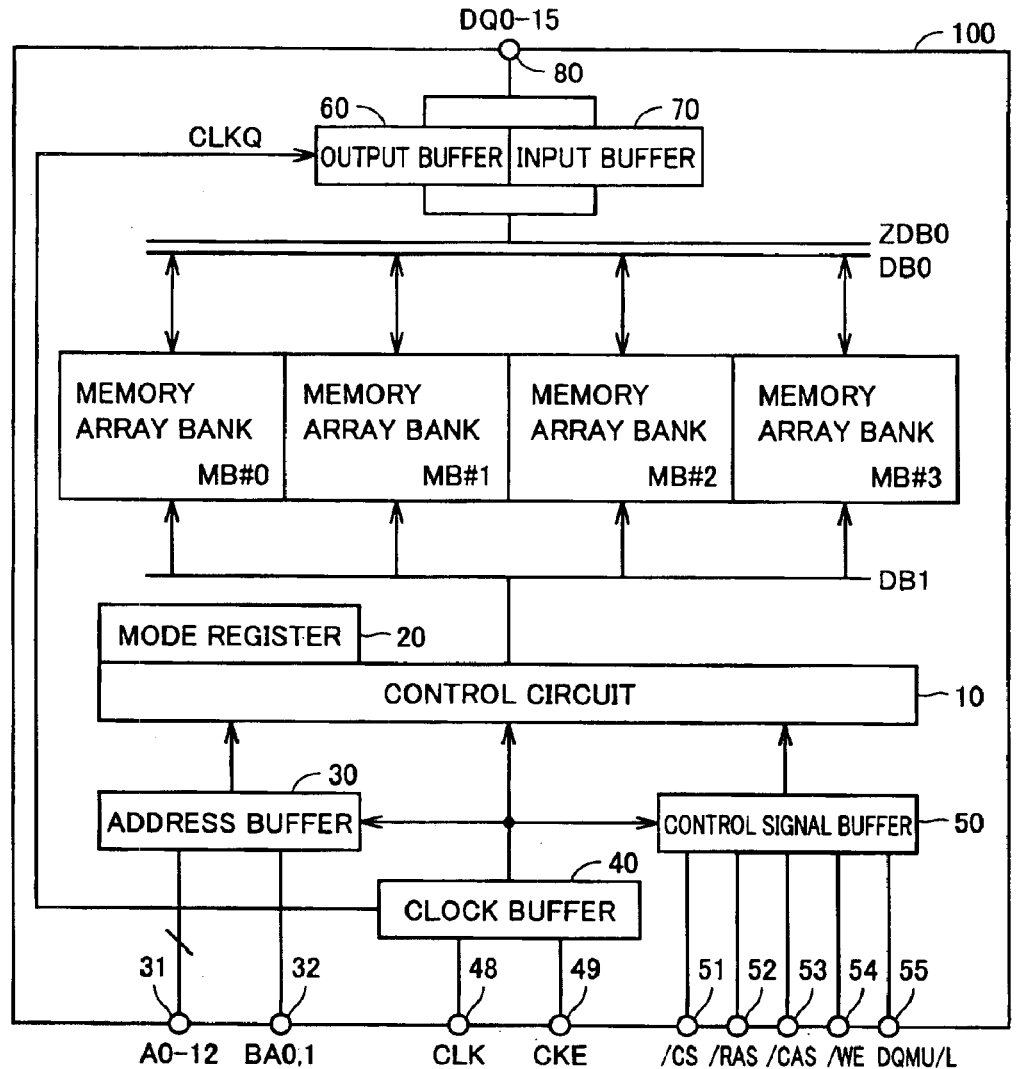
FIG. 1 is a schematic block diagram showing a whole structure of a synchronous semiconductor memory device according to a first embodiment of the invention.

FIG. 1 is a schematic block diagram showing a whole structure of a synchronous semiconductor memory device according to a first embodiment of the invention.

Referring to FIG. 1, a synchronous semiconductor memory device 100 includes memory array banks MB #0–MB #3, each of which has a plurality of memory cells arranged in rows and columns, and can operate independently of the others, a control circuit 10 controlling a whole operation in response to an internal control command, a mode register 20 storing a plurality of setting parameters corresponding to a plurality of operation modes, respectively, an address buffer 30, a clock buffer 40, a control signal buffer 50, an output buffer 60 and an input buffer 70. In the following description, reference characters "MB" generally indicate memory array banks MB #0–MB #3.

Synchronous semiconductor memory device 100 further includes a data bus pair DB0 and ZDB0 arranged between memory array banks MB and output and input buffers 60 and 70, and a data bus DB1 arranged between control circuit 10 and memory array banks MB.

Data bus line ZDB0 is complementary to data bus DB0. Data read from memory array bank MB onto data bus pair DB0 and ZDB0 is transmitted to output buffer 60. Data written from input buffer 70 onto data bus pair DB0 and ZDB0 is transmitted to memory array bank MB.

Data bus line DB1 is arranged between control circuit 10 and memory array bank MB, and transmits an internal control signal from control circuit 10 to memory array bank MB.

Mode register 20 is responsive to a mode register set command MRS, which is externally applied, and protects setting parameters, which correspond to the plurality of operation modes in synchronous semiconductor memory device 100. In accordance with the setting parameters held in mode register 20, latency setting as well as setting of a burst operation and others are executed.

Clock buffer 40 receives an external clock signal CLK and a clock enable signal CKE via clock terminals 48 and 49, respectively, and issues an internal clock signal to control signal buffer 50, address buffer 30 and control circuit 10. In this operation, the internal clock signal having a predetermined delay amount with respect to external clock signal CLK is supplied to output buffer 60 as an output clock signal CLKQ (i.e., clock signal CLKQ for output).

Control signal buffer 50 takes in and latches a chip select signal/CS, a row address strobe signal/RAS, a column address strobe signal/CAS and write enable signals/WE and DQMU/L, which are applied to control signal terminals 51–55, respectively, in synchronization with the internal clock signal received from clock buffer 40. Thereby, control signal buffer 50 issues the internal control signal to control circuit 10.

Address buffer 30 takes in and latches address signals A0–A12 and bank address signals BA0 and BA1 applied to address terminals 31 and 32. Thereby, address buffer 30 issues an internal address signal to control circuit 10 in synchronization with the internal clock signal received from clock buffer 40.

Control circuit 10 produces the internal control commands based on the internal control signal received from control signal buffer 50. Control circuit 10 issues the internal control commands to a row decoder, a column decoder and a combination of a preamplifier and a write amplifier (all of which are not shown) for controlling operations of circuits in these portions. Thereby, data signals DQ0–DQ15 are read from and written into memory array bank MB.

In the data write operation, input buffer 70 receives externally applied data signals via a data I/O terminal 80 in synchronization with the internal clock signal received from clock buffer 40.

Output buffer 60 operates in synchronization with output clock signal CLKQ received from clock buffer 40, and operates in the data read operation to provide the read data, which is transmitted onto data bus line DB, to data I/O terminal 80 as data signals DQ0–DQ15.

Figure 2:
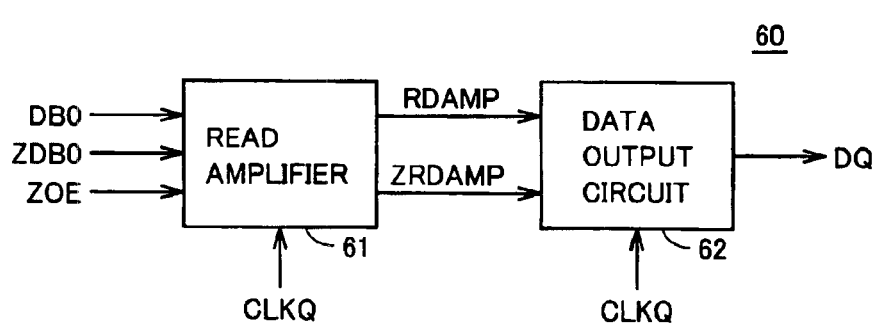
FIG. 2 is a block diagram showing a structure of an output buffer 60 shown in FIG. 1.

FIG. 2 is a block diagram showing a structure of output buffer 60 shown in FIG. 1.

Referring to FIG. 2, output buffer 60 is formed of a read amplifier 61 amplifying the data signal sent onto data bus pair DB0 and ZDB0, and a data output circuit 62 providing the amplified data signal to data I/O terminal 80.

Read amplifier 61 differentially amplifies the data signals sent via data bus pair DB0 and ZDB0 to produce signals RDAMP and ZRDAMP in synchronization with output clock signal CLKQ applied from clock buffer 40 in FIG. 1, and provides these signals RDAMP and ZRDAMP to data output circuit 62.

Data output circuit 62 provides signals RDAMP and ZRDAMP as output data signal DQ from data I/O terminal 80 not shown in FIG. 2 in synchronization with output clock signal CLKQ.

Figure 3A:
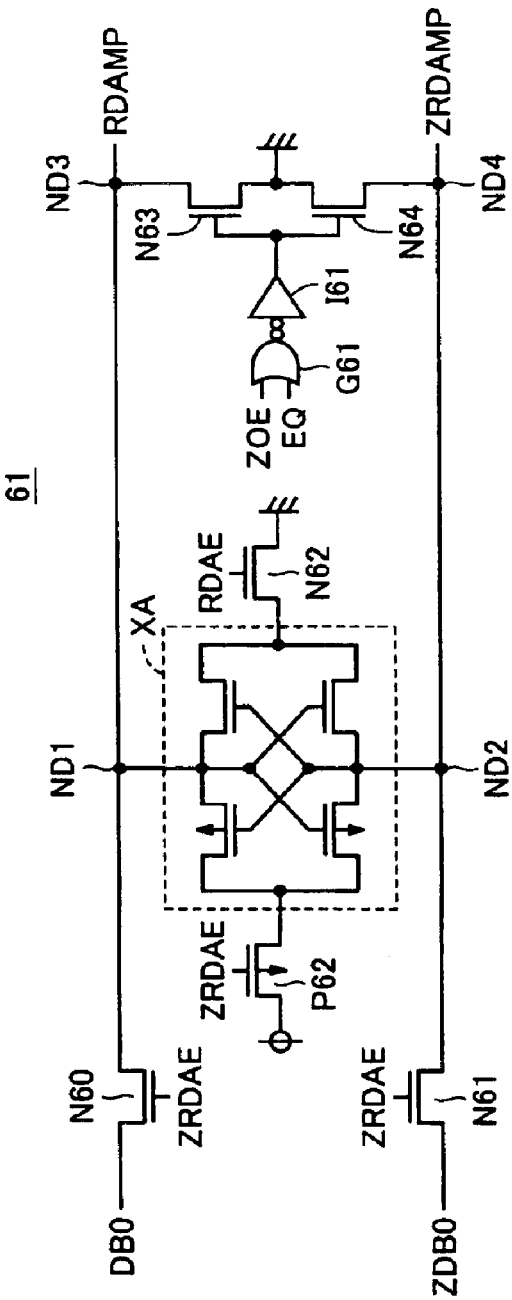
FIG. 3A is a circuit diagram showing a structure of a read amplifier 61 shown in FIG. 2.

FIG. 3A is a circuit diagram showing a structure of read amplifier 61 shown in FIG. 2.

Referring to FIG. 3A, read amplifier 61 includes N-channel MOS transistors N60 and N61, which connect data buses DB0 and ZDB0 to nodes ND1 and ND2 in response to a read amplifier activating signal ZRDAE, respectively, a cross-couple amplifier XA (i.e., amplifier XA of a cross-couple type), which operates in the active state to amplify differentially signals on nodes ND1 and ND2 and thereby to produce signals RDAMP and ZRDAMP, a P-channel MOS transistor P62, which supplies a power supply voltage Vdd to cross-couple amplifier XA when read amplifier activating signal ZRDAE is active, and an N-channel MOS transistor N62, which supplies a ground voltage GND to cross-couple amplifier XA when read amplifier activating signal RDAE is active.

Read amplifier 61 further includes a two-input NOR circuit G61, which provides a result of OR of a data output enable signal ZOE and a read amplifier equalization instructing signal EQ, and N-channel MOS transistors N63 and N64, which precharges nodes ND3 and ND4 to ground potential GND when it receives an output signal of two-input NOR circuit G61 via an inverter I61.

Figure 3B:
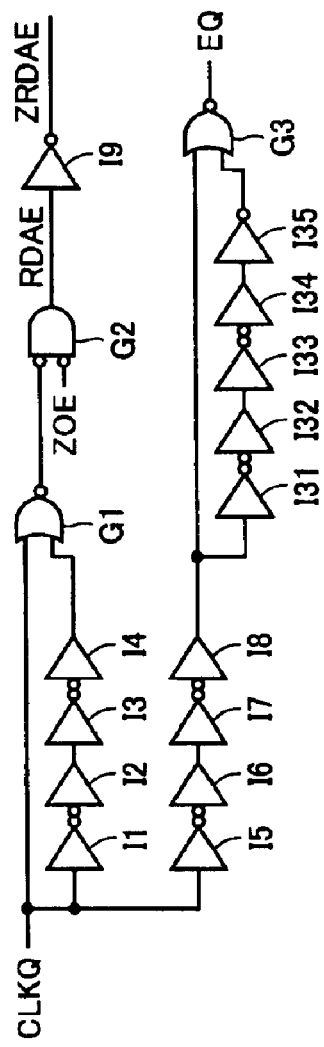
FIG. 3B is a circuit diagram showing a structure of a portion generating control signals.

FIG. 3b is a circuit diagram showing a structure of a portion, which is arranged in read amplifier 61 shown in FIG. 3A for producing various control signals.

Referring to FIG. 3b, read amplifier activating signal RDAE is produced based on output clock signal CLKQ and data output enable signal ZOE.

Output clock signal CLKQ is applied to a first input node of a two-input NOR circuit G1, and is also applied to a second input node of two-input NOR circuit G1 via a delay stage formed of inverters I1–I4. Two-input NOR circuit G1 provides a result of OR of these two inputs.

A two-input NOR circuit G2 receives the output signal of two-input NOR circuit G1 on its first input node, and also receives data output enable signal ZOE on its second input node. Read amplifier activating signal RDAE is produced as a result of the OR of these signals. Read amplifier activating signal ZRDAE is produced via an inverter I9.

Output clock signal CLKQ is applied to a first input node of a two-input NOR circuit G3 via a delay stage formed of inverters I5–I8, and is also applied to a second input node of two-input NOR circuit G3 via a delay stage formed of inverters I5–I8 and a delay stage formed of inverters I31–I35. Read amplifier equalization instructing signal EQ is produced as a result of the OR of these signals.

An operation of read amplifier 61 shown in FIG. 3A will now be described.

In a data write operation and a precharge operation, data output enable signal ZOE is at an "H" (logical high) level, and two-input NOR circuit G2 of the control signal generating portion in FIG. 3B issues read amplifier activating signal RDAE at an "L" (logical low) level independently of output clock signal CLKQ. Thereby, read amplifier activating signal ZRDAE at the "H" level is issued through inverter I9.

The output signal of inverter I61 attains the "H" level in response to data output enable signal ZOE at the "H" level.

In read amplifier 61 shown in FIG. 3A, N-channel MOS transistors N60 and N61 are turned on in response to read amplifier activating signal ZRDAE at the "H" level, and thereby couples nodes ND1 and ND2 to data buses DB and ZDB, respectively. In response to the output signal at the "H" level provided from inverter I61, N-channel MOS transistors N63 and N64 are turned on to precharge nodes ND3 and ND4 to the level of ground voltage GND. Further, in response to read amplifier activating signal ZRDAE at the "H" level and read amplifier activating signal RDAE at the "L" level, P- and N-channel MOS transistors P62 and N62 are both turned off to deactivate cross-couple amplifier XA.

When the data read cycle starts, data output enable signal ZOE attains the "L" level. In the control signal generating portion shown in FIG. 3B, two-input NOR circuit G2 produces read amplifier activating signals RDAE and ZRDAE each changing between the "H" and "L" levels in accordance with the output signal of two-input NOR circuit G1 produced based on output clock signal CLKQ. Two-input NOR circuit G3 produces a read amplifier equalization instructing signal EQ, which attains the "H" level in accordance with the same timing as the "H" level of read amplifier activating signal ZRDAE, and will attain the "L" level after a predetermined period.

When read amplifier activating signal ZRDAE attains the "H" level, N-channel MOS transistors N60 and N61 in read amplifier 61 are turned on to couple electrically data buses DB and ZDB to nodes ND1 and ND2, respectively. In this state, read amplifier equalization instructing signal EQ attains the "H" level so that N-channel MOS transistors N63 and N64 are turned on to hold node nodes ND3 and ND4 at the level of ground voltage GND.

When read amplifier equalization instructing signal EQ attains the "L" level after a predetermined period, N-channel MOS transistors N63 and N64 are turned off to finish an operation of precharging nodes ND3 and ND4. Thereby, read data to be transmitted onto data buses DB and ZDB are sent to nodes ND1 and ND2, respectively. Nodes ND1 and ND2 are driven to the potentials corresponding to the transmission data.

When read amplifier activating signals ZRDAE and RDAE attain the "L" and "H" levels, respectively, N-channel MOS transistors N60 and N61 are turned off to isolate electrically nodes ND1 and ND2 from data buses DB and ZDB, respectively. Cross-couple amplifier XA is supplied with power supply voltage Vdd and ground voltage GND from P- and N-channel MOS transistors P62 and N62, respectively, and differentially amplifies the data on nodes ND1 and ND2. Node ND1 receives the read data sent via data bus DB, and node ND2 receives reference data sent via data bus ZDB. Therefore, polarity discrimination of the read data can be performed by differentially amplifying the potentials on nodes ND1 and ND2. Further, the read data sent from data bus DB is transmitted as signal RDAMP to data output circuit 62 in FIG. 2. The reference data sent from data bus ZDB is transmitted as signal ZRDAMP complementary to signal RDAMP to data output circuit 62.

Figure 4A:
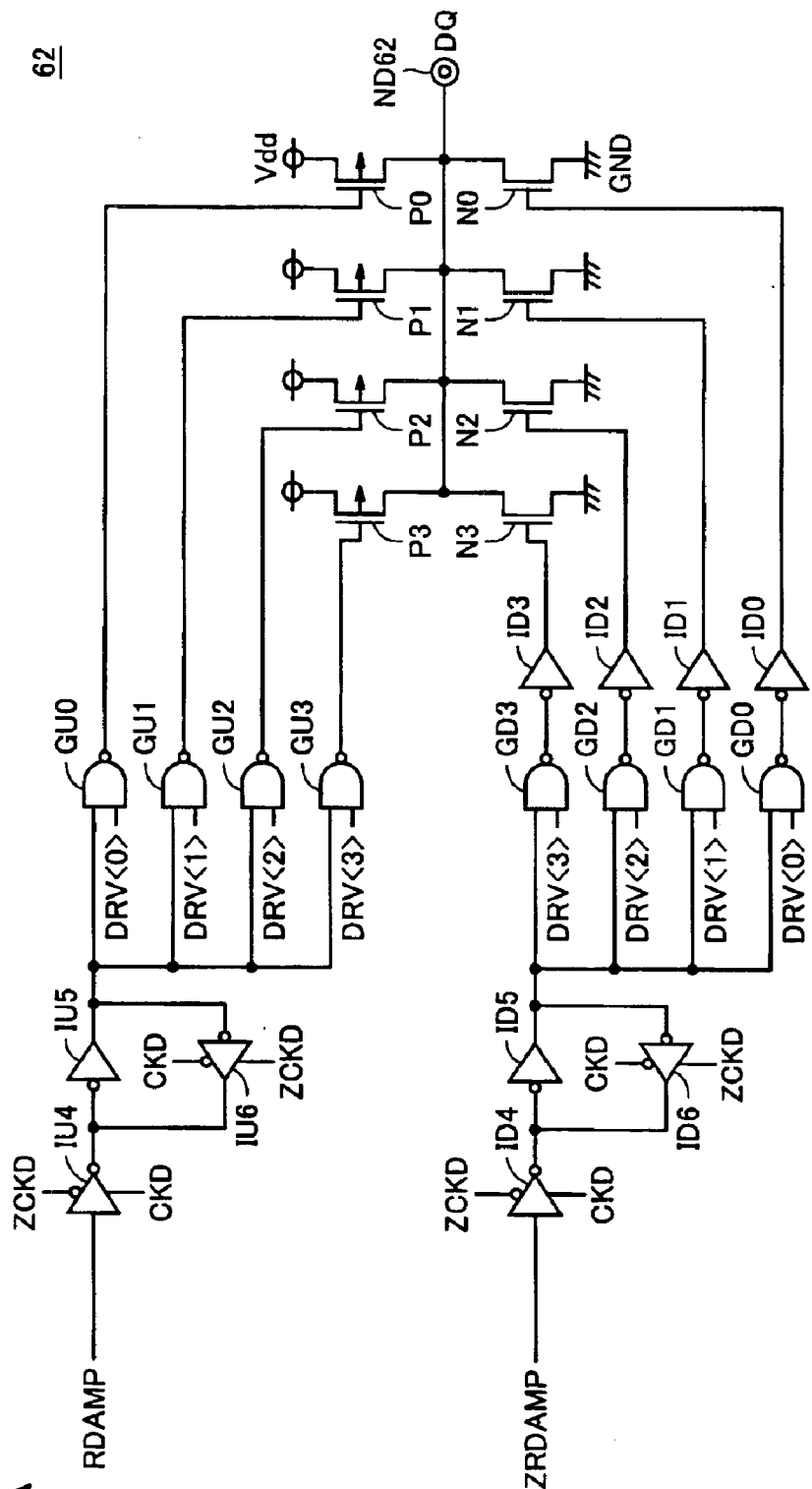
FIG. 4A is a circuit diagram showing a structure of a data output circuit 62 shown in FIG. 2.

FIG. 4A is a circuit diagram showing a structure of data output circuit 62 shown in FIG. 2.

Referring to FIG. 4A, data output circuit 62 includes, as output driver transistors, P-channel MOS transistors P0–P3, which are connected in parallel between power supply node Vdd and output node ND62 of output data signal DQ as well as N-channel MOS transistors N0–N3 connected in parallel between an output node ND61 and ground node GND.

Data output circuit 62 further includes two-input NAND circuits GU0–GU3 and GD0–GD3 for transmitting signals RDAMP and ZRDAMP sent from read amplifier 61 to the output driver transistors, respectively, as well as inverters IU4–IU6 and ID1–ID6.

P-channel MOS transistors P0–P3 receive on their gates the output signals of two-input NAND circuits GU0–GU3, respectively.

N-channel MOS transistors N0–N3 receive on their gates the output signals of two-input NAND circuits GD0–GD3 via inverters ID0–ID3, respectively.

Two-input NAND circuits GU0–GU3 receive signal RDAMP on their first input nodes via inverters IU4 and IU5, and also receive current drive power switch signals DRV<3:0> (=DRV<3>–DV<0>), which will also be referred to as "drive power switch signals" hereinafter, for the output driver transistors on their second input nodes. Thereby, each of two-input NAND circuits GU0–GU3 issue a result of NAND of the received two input signals.

Each of two-input NAND circuits GD0–GD3 receives signal ZRDAMP on its first input node via inverters ID4 and ID5, and also receives corresponding one of drive power switch signals DRV<3:0> on its second input node. Thereby, each of two-input NAND circuits GD0–GD3 issues a result of NAND of the received two input signals.

Between inverters IU4 and IU6 transmitting signal RDAMP to the first input nodes of two-input NAND circuits GU0–GU3, inverter IU4 inverts the input signal in response to the rising of a clock signal CKD, and inverter IU6 inverts the input signal in synchronization with the falling of clock signal CKD.

Each of inverters IU5 and IU6 has one of the input nodes connected to the output node of the other, and forms a latch circuit in accordance with the timing of falling of clock signal CKD.

Therefore, signal RDAMP is held by the latch circuit in response to the falling of clock signal CKD, and is provided to the first input node of each of two-input NAND circuits GU0–GU3 in response to the rising of clock signal CKD.

Similar operations are performed by inverters ID4 and ID6, which transmit signal ZRDAMP to the first input nodes of two-input NAND circuits GD0–GD3. Thus, inverter ID4 inverts the input signal in synchronization with the rising of clock signal CKD, and inverter ID6 inverts the input signal in synchronization with the falling of clock signal CKD.

Further, inverters ID5 and ID6 form a latch circuit in accordance with the timing of falling of clock signal CKD.

Therefore, signal ZRDAMP is held by the latch circuit in response to the falling of clock signal CKD, and is issued to the first input nodes of two-input NAND circuits GD0–GD3 in response to the rising of clock signal CKD.

Figure 4B:
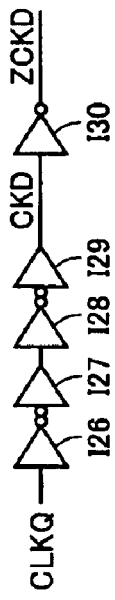
FIG. 4B shows a structure of a portion producing a clock signal CKD controlling output timing.

FIG. 4B shows an example of a structure of a portion, which is arranged in data output circuit 62 shown in FIG. 4A for producing clock signal CKD controlling the output timing.

Referring to FIG. 4B, clock signal CKD is prepared by delaying output clock signal CLKQ by a delay stage, which is formed of inverters I26–I29 connected in series. The delay stage is formed of a plurality of delay units DU each including the two inverters connected in series. Thereby, clock signal CKD is a signal delayed from output clock signal CLKQ by a predetermined delay amount, which depends on a unit delay amount of the delay unit and the number of delay units. Further, a clock signal ZCKD complementary to clock signal CKD is produced by an inverter I30 receiving clock signal CKD.

Referring to FIG. 4A again, when signal RDAMP is applied to two-input NAND circuits GU0–GU3 via inverters IU4 and IU5, it is converted into four signals each having a binary logic of "H" or "L" depending on the result of AND between signal RDAMP and corresponding one of drive power switch signals DRV<3:0>. These four converted signals are applied to gates of P-channel MOS transistors P0–P3, respectively. P-channel MOS transistors P0–P3 are driven to the on/off states in response to the logics of corresponding signals. The P-channel MOS transistors, which are turned on, form a current path between power supply node Vdd and output node ND62. The current amount of the current path thus formed, i.e., the current drive power of the output driver transistors depends on the transistor size depending on the number of the turned-on P-channel MOS transistors.

Likewise, when signal ZRDAMP is applied to two-input NAND circuits GD0–GD3 via inverters ID4 and ID5, it is converted into four signals each having a binary logic of "H" or "L" depending on the result of AND between it and corresponding one of drive power switch signals DRV<3:0>. These four converted signals are applied to gates of N-channel MOS transistors N0–N3 via inverters ID0–ID3, respectively. N-channel MOS transistors N0–N3 are driven to the on/off states in response to the logics of the corresponding signals. The N-channel MOS transistors in the on state form a current path between ground node GND and output node ND62. A current amount of the current path thus formed, i.e., the current drive power of the output driver transistors corresponds to the transistor size depending on the number of the turned-on N-channel MOS transistors.

Drive power switch signals DRV<3:0> adjusting the current drive power of the output driver transistors will now be described in detail.

As already described, the output driver transistors are formed of the plurality of P-channel MOS transistors P0–P3 connected in parallel between power supply node Vdd and output node ND62, and the plurality of N-channel MOS transistors N0–N3 connected in parallel between output node ND62 and ground node GND. These MOS transistors are selectively turned on in accordance with the output signals of two-input NAND circuits GU0–GU3 and GD0–GD3, respectively.

The number of MOS transistors thus turned on is changed to adjust a total gate width so that it is possible to adjust the current drive power, which pulls up the output data signal to the "H" level, or pulls down the output data signal to the "L" level. In this embodiment, the number of MOS transistors, which are turned on, can be selectively set to, e.g., four values from one to four. Thereby, the current drive power achieved by turning on the maximum number of, i.e., four MOS transistors is four times larger than that achieved by turning on the minimum number of, i.e., one MOS transistor.

The logical levels of the output signals of two-input NAND circuits GU0–GU3 and GD0–GD3 depend on drive power switch signals DRV<3:0>. Drive power switch signals DRV<3:0> are predetermined to achieve the intended current drive power by blowing fuse elements arranged in a drive power setting fuse circuit, i.e., a fuse circuit for setting the drive power.

Figures 5A, 5B:
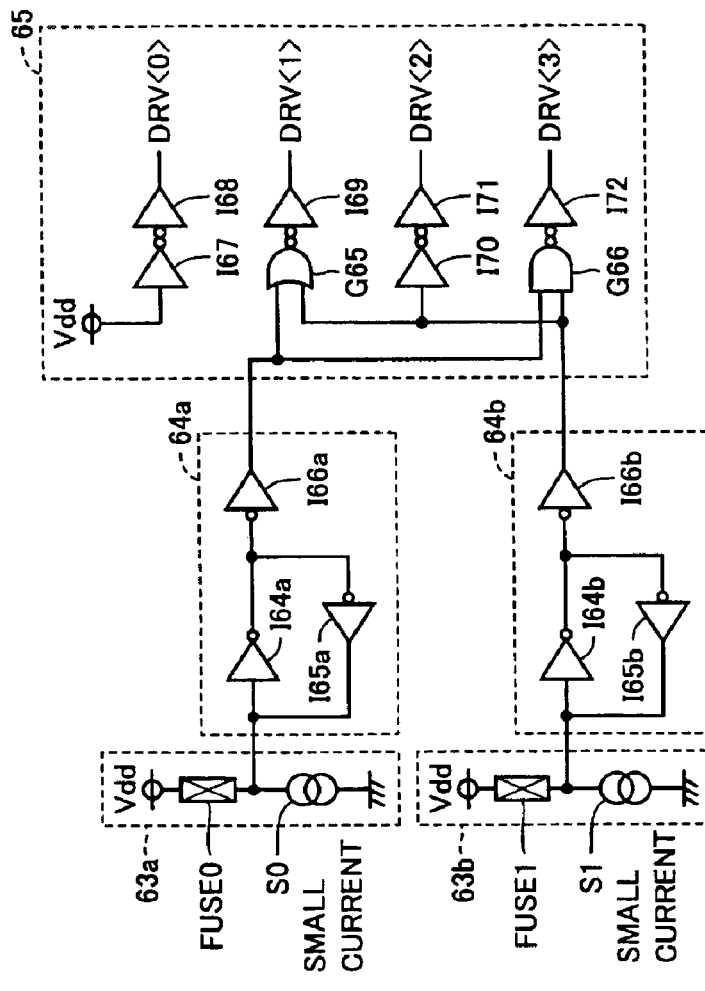
FIG. 5A is a circuit diagram showing a structure of a fuse circuit for setting a drive power.
FIG. 5B is a truth table illustrating producible drive power switch signals DRV<3:0>.

FIG. 5A is a circuit diagram showing a structure of the drive power setting fuse circuit.

Referring to FIG. 5A, the drive power setting fuse circuit includes program portions 63a and 63b each formed of formed of a combination of a fuse element FUSE0 and a current supply S0, which are connected in series between power supply node Vdd and ground node GND, or a combination of a fuse element FUSE1 and a current supply S1, which are connected in series between power supply node Vdd and ground node GND. The drive power setting fuse circuit further includes latch portions 64a and 64b, which are formed of a combination of inverters I64a–I66a and a combination of inverters I64b–I66b, respectively, as well as a decoder portion 65, which is formed of a two-input NOR circuit G65, a two-input NAND circuit G66 and inverters I67–I72. Current supplies S0 and S1 of a low current type are employed for suppressing current consumption.

Program portion 63 a is nonvolatilely set to the on state or off state in accordance with entry/non-entry of a program. When the program is not entered in fuse element FUSE0, i.e., when blowing by laser blow input is not performed, program portion 63a attains the on state. When the program input is effected on fuse element FUSE0, i.e., when blowing is performed by the laser blow input, program portion 63a is nonvolatilely turned off.

Likewise, program portion 63b is set to the on state when blowing by the laser blow input is not effected on fuse element FUSE1. When blowing by the laser blow input is effected, program portion 63b is nonvolatilely set to the off state.

When program portions 63a and 63b are on, the potentials on the output nodes are set to the "H" level. When program portions 63a and 63b are off, the potentials of the output nodes are set to the "L" level. The potentials on the output nodes are transmitted to corresponding latch portions 64a and 64b, respectively.

Latch portion 64a includes inverters I64a and I65a each having an output end coupled to an input end of the other inverter I65a or I64a, and an inverter I66a inverting the output of inverter I64a and outputting it. Therefore, the output potential of program portion 63a is held by latch portion 64a, and is transmitted from the output node of inverter I66a to decoder portion 65.

Likewise, latch portion 64b includes inverters I64b and I65b each having an output end coupled to an input end of the other inverter I65b or I64b, and an inverter I66b inverting the output of inverter I64b and outputting it. Therefore, the output potential of program portion 63b is held by latch portion 64b, and is transmitted from the output node of inverter I66b to decoder portion 65.

Decoder portion 65 decodes the potential applied from latch portions 64a and 64b, and thereby produces drive power switch signals DRV<3:1>.

Drive power switch signal DRV<0> is produced by inverters I67 and I68 connected in series to power supply node Vdd.

Two-input NOR circuit G65 provides a result of OR of the output potentials of latch portions 64a and 64b. Inverter I69 receiving the output signal of two-input NOR circuit G65 produces drive power switch signal DRV<1>.

Inverter I70 inverts the output potential of latch portion 64b. Inverter I71 receiving the output signal of inverter I70 produces drive power switch signal DRV<2>.

Two-input NAND circuit G66 provides a result of NAND of the output potentials of latch portions 64a and 64b. Inverter I72 receiving the output signal of two-input NAND circuit G66 produces drive power switch signal DRV<3>.

FIG. 5B is a truth table illustrating drive power switch signals DRV<3:0> produced by the drive power setting fuse circuit.

Referring to FIG. 5B, drive power switch signals DRV<3:0> in four patterns are producible in accordance with presence/absence of the laser blow input to fuse elements FUSE0 and FUSE1 of program portions 63a and 63b, i.e., blowing/non-blowing of fuse elements FUSE0 and FUSE1. The output driver transistor(s) of the number corresponding to the pattern of drive power switch signals DRV<3:0> are turned so that the current drive power is determined. In the truth table, "1" represents the blowing of the fuse element, and "0" represents the non-blowing.

More specifically, if both fuse elements FUSE0 and FUSE1 are blown, drive power switch signals DRV<3:0> (i.e., DRV<0>–DRV<3>) are set to "H", "L", "L" and "L", respectively. Drive power switch signals DRV<3:0> are applied to data output circuit 62 shown in FIG. 4A.

Referring to FIG. 4A again, drive power switch signals DRV<3:0> are applied to two-input NAND circuits GU0–GU3 in data output circuit 62, respectively. Each of two-input NAND circuits GU0–GU3 provides a result of NAND of corresponding one of drive power switch signals DRV<3:0> and signal RDAMP in synchronization with clock signal CKD.

When signal RDAMP is at the "H" level, i.e., when read data is at the "H" level, two-input NAND circuits GU0–GU3 issue signals at "L", "H", "H" and "H" levels, respectively. When P-channel MOS transistors P0–P3 receive signals at "L", "H", "H" and "H" levels, respectively, only P-channel MOS transistor P0 is turned on to form a current path between power supply node Vdd and output node ND62.

When signal ZRDAMP is at the "H" level, i.e., when read data is at the "L" level, two-input NAND circuits GU0–GU3 issue signals at "H", "L", "L" and "L" levels, respectively. When N-channel MOS transistors N0–N3 receive signals at "H", "L", "L" and "L" levels on their gates, respectively, only N-channel MOS transistor N0 is turned on to form a current path between ground node GND and output node ND62.

As a result, the output driver transistors provide the current drive power of "onefold" ("1×" in FIG. 5B) in the above state.

When fuse element FUSE0 is not blown and fuse element FUSE1 is blown, drive power switch signals DRV<3:0> are set to "H", "H", "L" and "L", respectively.

In data output circuit 62, when signal RDAMP is at the "H" level (i.e., read data corresponds to the "H" level), two-input NAND circuits GU0–GU3 issue signals of "L", "L", "H" and "H" from their output nodes in synchronization with clock signal CKD, respectively. When P-channel MOS transistors P0–P3 receive the signals of "L", "L", "H" and "H" on their gates, respectively, P-channel MOS transistors P0 and P1 are turned on to form a current path between power supply node Vdd and output node ND62.

When signal ZRDAMP is at the "H" level (i.e., read data corresponds to the "L" level), two-input NAND circuits GU0–GU3 issue signals of "H", "H", "L" and "L" from their output nodes, respectively. When N-channel MOS transistors N0–N3 receive on their gates the signals of "H", "H", "L" and "L", respectively, N-channel MOS transistors N0 and N1 are turned on to form a current path between ground node GND and output node ND62.

In this case, therefore, the current drive power of the output driver transistors is set to "twofold" ("2×" in FIG. 5B).

When fuse element FUSE0 is blown, and fuse element FUSE1 is not blown, drive power switch signals DRV<3:0> are set to "H", "H", "H" and "L", respectively.

In data output circuit 62, when signal RDAMP is at the "H" level, two-input NAND circuits GU0–GU3 issue signals of "L", "L", "L" and "H" from their output nodes in synchronization with clock signal CKD, respectively. When P-channel MOS transistors P0–P3 receive the signals of "L", "L", "L" and "H", respectively, P-channel MOS transistors P0, P1 and P2 are turned on to form a current path between power supply node Vdd and output node ND62.

When signal ZRDAMP is at the "H" level, two-input NAND circuits GU0–GU3 issue signals of "H", "H", "H" and "L" from their output nodes in synchronization with clock signal CKD, respectively. When N-channel MOS transistors N0–N3 receive on their gates the signals of "H", "H", "H" and "L", respectively, N-channel MOS transistors N0, N1 and N2 are turned on to form a current path between ground node GND and output node ND62.

In this case, therefore, the current drive power of the output driver transistors is set to "threefold" ("3×" in FIG. 5B).

Finally, when neither of fuse elements FUSE0 nor FUSE1 is blown, drive power signals DRV<3:0> are set to "H", "H", "H" and "H", respectively.

In the data output circuit 62, when signal RDAMP is at the "H" level, two-input NAND circuits GU0–GU3 issue the signals of "L", "L", "L" and "L" from their output nodes in synchronization with clock signal CKD, respectively. When P-channel MOS transistors P0–P3 receive on their gates the signals of "L", "L", "L" and "L", respectively, all P-channel MOS transistors P0–P3 are turned on to form a current path between power supply node Vdd and output node ND62.

When signal ZRDAMP is at the "H" level, two-input NAND circuits GU0–GU3 issue signals of "H", "H", "H" and "H" from their output nodes in synchronization with clock signal CKD, respectively. When N-channel MOS transistors N0–N3 receive on their gates the signals of "H", "H", "H" and "H", respectively, all N-channel MOS transistors N0–N3 are turned on to form a current path between ground node GND and output node ND62.

In this case, therefore, the current drive power of the output driver transistors is set to "fourfold" ("4×" in FIG. 5B).

As described above, by selecting the blowing/non-blowing of fuse elements FUSE0 and FUSE1 of the drive power setting fuse circuit, the drive power of the output driver transistors can be adjusted between "onefold" and "fourfold" inclusive. By adjusting the current drive power in accordance with the operation frequency, it is possible to provide the current drive powers suitable for various operations including the low- and high-speed operations.

Figure 6:
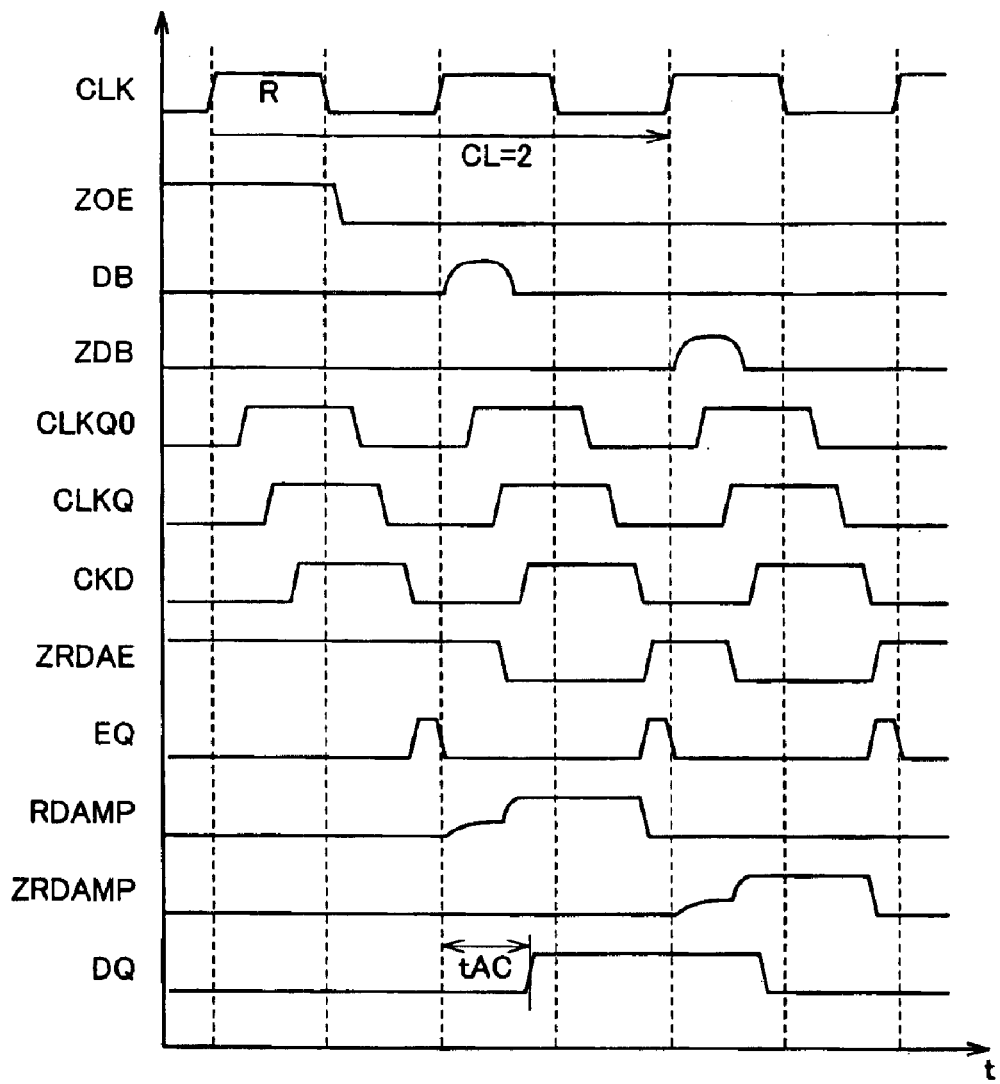
FIG. 6 illustrates operation waveforms in a data read operation of the synchronous semiconductor memory device according to the first embodiment.

FIG. 6 is an operation waveform diagram illustrating a data read operation of synchronous semiconductor memory device 100 having the above structure.

Referring to FIG. 6, when external clock signal CLK having a predetermined period is applied, clock buffer 40 produces output clock signal CLKQ by delaying external clock signal CLK by a predetermined delay amount, and supplies it to output buffer 60. As described later, a clock signal CLKQ0 is produced by clock buffer 60 during internal processing thereof.

As illustrated in FIG. 4B, data output circuit 62 in output buffer 60 further delays output clock signal CLKQ by a predetermined delay amount to produce clock signal CKD. In synchronization with clock signal CKD, data output circuit 62 issues data signal DQ to data I/O terminal 80.

Read amplifier 61 of output buffer 60 produces read amplifier equalization instructing signal EQ, which attains the "H" level for a predetermined period, based on output clock signal CLKQ. Also, read amplifier activating signals RDAE and ZRDAE are produced based on output clock signal CLKQ and data output enable signal ZOE.

As illustrated in FIG. 6, synchronous semiconductor memory device 100 finishes the precharge operation when data output enable signal ZOE is activated to the "L" level and read amplifier equalization instructing signal EQ changes from the "H" level to the "L" level.

When read amplifier activating signal ZRDAE attains the "H" level, the read data transmitted by data buses DB and ZDB is transferred as signals RDAMP and ZRDAMP to cross-couple amplifier XA in read amplifier 61.

When read amplifier activating signal ZRDAE attains the "L" level, cross-couple amplifier XA differentially amplifies the received data. Thereby, signals RDAMP and ZRDAMP are driven to the "H" or "L" level in accordance with the read data, and are sent to data output circuit 62.

When data output circuit 62 receives signals RDAMP and ZRDAMP, it provides output data signal DQ to data I/O terminal 80 in synchronization with the rising of clock signal CKD. Therefore, as illustrated in FIG. 6, output data signal DQ is issued with a delay of a constant time tAC with respect to clock signal CLK.

Clock signal CKD, which determines the output timing of data output circuit 62, is produced based on output clock signal CLKQ, which is delayed in clock buffer 40 by the predetermined delay amount with respect to external clock signal CLK, as described above.

In a conventional synchronous semiconductor memory device, the delay amount of clock signal CLKQ is generally fixed to a time, which directly depends on the number of delay units arranged in the clock buffer. In data output circuit 62, therefore, if the current drive power of the output driver transistors is adjusted in the forgoing manner, such a problem occurs that a shift or deviation occurs in output timing of output data signal DQ.

In the following description, a general circuit structure of a clock buffer used in a conventional semiconductor memory device is first described for illustrating the foregoing problem from the viewpoint of a relationship between the current drive power of the output driver transistors and the data output timing. Then, the clock buffer, which is proposed according to the embodiment for overcoming the above problem, will be described in detail.

Figure 7:
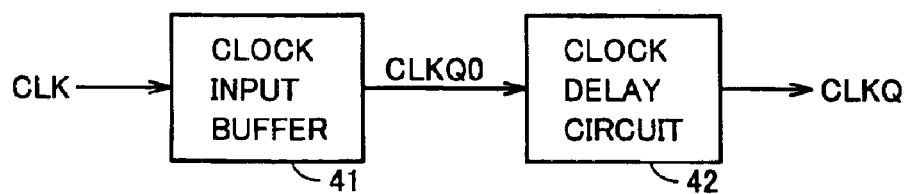
FIG. 7 is a function block diagram illustrating a structure of a general clock buffer.

FIG. 7 is a function block diagram showing a general structure of a clock buffer.

Referring to FIG. 7, the clock buffer includes a clock input buffer 41 receiving clock signal CLK and a clock delay circuit 42 delaying external clock signal CLK by a constant delay amount.

Figure 8:
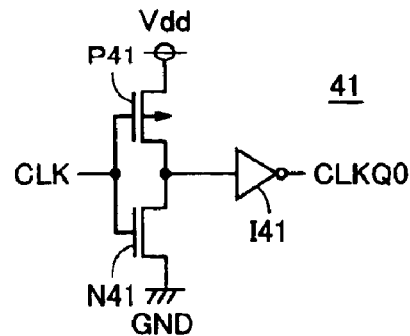
FIG. 8 is a circuit diagram showing a structure of a clock input buffer 41 shown in FIG. 7.

FIG. 8 is a circuit diagram showing a structure of clock input buffer 41 shown in FIG. 7.

Referring to FIG. 8, clock input buffer 41 has P- and N-channel MOS transistors P41 and N41 connected in series between power supply node Vdd and ground node GND, and also has an inverter I41.

P- and N-channel MOS transistors P41 and N41 form a CMOS inverter, which receives external clock signal CLK on its gate, and provides an inverted signal of external clock signal CLK. Inverter I41 provides clock signal CLKQ0 produced by further inverting the inverted signal of external clock signal CLK.

Figure 9:
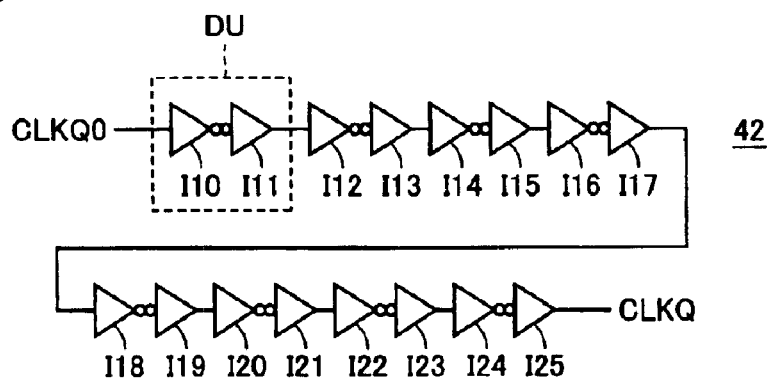
FIG. 9 is a circuit diagram showing a structure of a clock delay circuit 42 shown in FIG. 7.

FIG. 9 shows a structure of a clock delay circuit 42 shown in FIG. 7.

Referring to FIG. 9, clock delay circuit 42 is formed of an even number of inverters I10–I25 coupled in series between the input and output nodes. The inverters I10–I25 form the plurality of delay units DU each including the two inverters.

In this structure, clock signal CLKQ0 sent from clock input buffer 41 is delayed by a delay amount of a fixed value corresponding to a product of a unit delay amount per delay unit and the number of the delay units, and thereby output clock signal CLKQ is output.

Thus, in the conventional synchronous semiconductor memory device, the clock buffer issues output clock signal CLKQ always having a constant delay amount with respect to external clock signal CLK.

Figure 10:
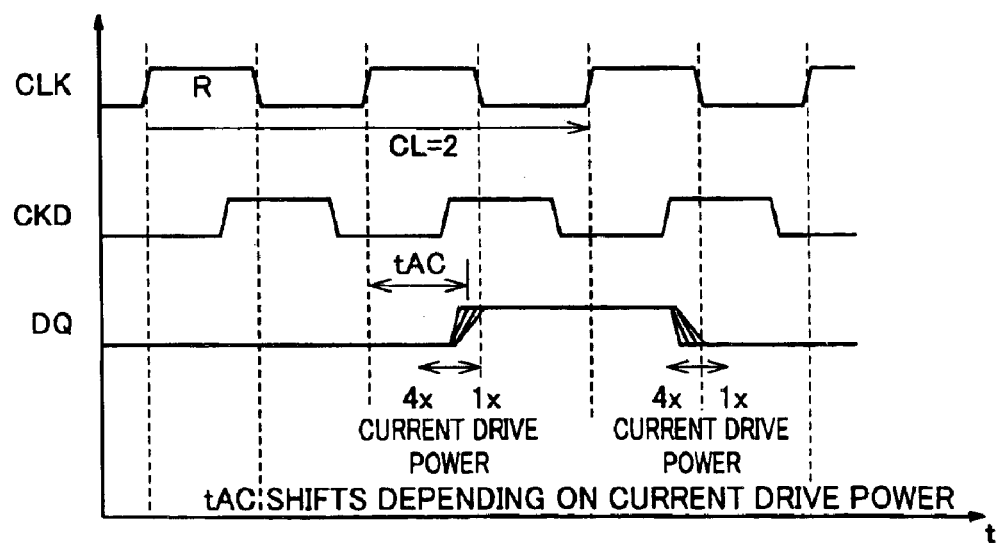
FIG. 10 illustrates operation waveforms in a data read operation of a conventional synchronous semiconductor memory device provided with the clock buffer shown in FIG. 7.

FIG. 10 illustrates operation waveforms in a data read operation of a conventional semiconductor memory device equipped with the clock buffer shown in FIG. 7.

Output clock signal CLKQ prepared by delaying external clock signal CLK by a constant delay amount is further delayed by data output circuit 62 in FIG. 4A, and thereby is converted into clock signal CKD delayed by the constant delay amount.

As illustrated in FIG. 10, output data signal DQ is output from data I/O terminal 80 in accordance with output timing defined by the rising of clock signal CKD. If this output is accurately synchronized with clock signal CKD, the output is delayed by delay time tAC with respect to external clock signal CLK.

In data output circuit 62, when the current drive power of the output driver transistors is changed from "onefold" to "fourfold", the shift with respect to clock signal CKD occurs in the output timing. As the current drive power decreases, this shift increases, and the output timing is delayed by a time larger than delay time tAC.

Usually, delay time tAC from the activation of external clock signal CLK to the output is defined in a data sheet as a specification item representing high-speed properties of a microprocessor. Therefore, if the shift in output timing occurs due to change in current drive power of data output circuit 62, this causes a large problem in reliability of products.

Accordingly, the embodiment proposes a synchronous semiconductor memory device, which overcomes the above problem by allowing data output in accordance with uniform output timing independent of the current drive power.

Figure 11:
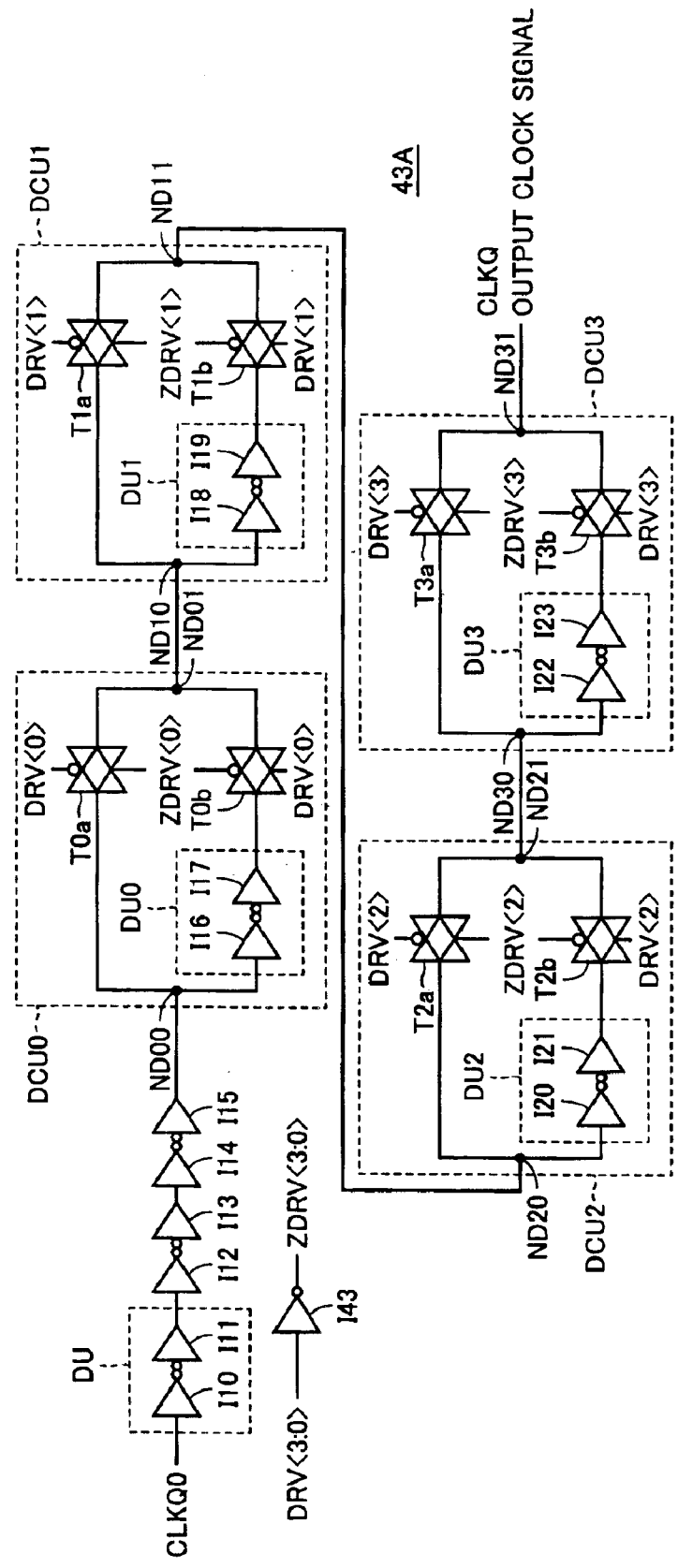
FIG. 11 is a circuit diagram showing a structure of a clock delay adjusting circuit 43A included in a clock buffer 40 of a synchronous semiconductor memory device according to a first embodiment.

FIG. 11 is a circuit diagram showing a structure of a clock delay adjusting circuit 43A included in clock buffer 40 of the synchronous semiconductor memory device according to the first embodiment. Clock delay adjusting circuit 43A according to the first embodiment has such a distinctive feature that the delay amount, which directly depends the number of the delay units according to conventional clock delay circuit 42 shown in FIG. 9, is variable in accordance with the change in current drive power of the output driver transistors.

Referring to FIG. 11, clock delay adjusting circuit 43A includes the plurality of inverters I10–I23 coupled in series between the input and output nodes.

Inverters I10–I23 form the plurality of delay units DU each including the two inverters. Clock signal CLKQ provided from clock input buffer 41 (not shown in FIG. 11) is delayed by the delay amount, which is determined by the number of the active delay units, and is output as output clock signal CLKQ.

Clock delay adjusting circuit 43A further includes delay adjusting units DCU0–DCU3 adjusting the delay amounts of delay units DU0–DU3, respectively.

Delay adjusting unit DCU0 has a transfer gate T0a coupled between nodes ND01 and ND01 as well as delay unit DU0 and a transfer gate T0b coupled in series between nodes ND00 and ND01.

Transfer gates T0a and T0b are closed complementarily to each other in response to drive power switch signals DRV<0> and ZDRV<0>, respectively, and thereby transmit the signal on node ND00 to node ND01. Drive power switch signals ZDRV<3:0> are produced by an inverter I43 receiving drive power switch signals DRV<3:0>, and are complementary to signals DRV<3:0>.

When drive power switch signal DRV<0> is at the "H" level, transfer gate T0b is closed to transmit the signal on node ND00 to node ND01 via delay unit DU0. When drive power switch signal DRV<0> is at the "L" level, transfer gate T0a is closed to transmit directly the signal on node ND00 to node ND01. Thus, when drive power switch signal DRV<0> is at the "H" level, clock signal CLKQ0 transmitted to node ND00 is delayed by the delay amount of delay unit DU0, and then is transmitted to next delay adjusting unit DCU1. When drive power switch signal DRV<0> is at the "L" level, clock signal CLKQ0 transmitted to node ND00 is transmitted to next delay adjusting unit DCU1 without being delayed.

Delay adjusting unit DCU1 has a transfer gate T1a coupled between nodes ND10 and ND11 as well as delay unit DU1 and a transfer gate T1b coupled in series between nodes ND10 and ND11. Transfer gates T1a and T1b are closed complementarily to each other in response to drive power switch signals DRV<1> and ZDRV<1>, respectively, and thereby transmit the signal on node ND10 to node ND11.

When drive power switch signal DRV<1> is at the "H" level, clock signal CLKQ0 transmitted to node ND10 is delayed by the unit delay amount of delay unit DU1, and is transmitted to next delay adjusting unit DCU2. When drive power switch signal DRV<1> is at the "L" level, clock signal CLKQ0 transmitted to node ND10 is transmitted to next delay adjusting unit DCU2 without being delayed.

Delay adjusting unit DCU2 has a transfer gate T2a coupled between nodes ND20 and ND21 as well as delay unit DU2 and a transfer gate T2b coupled in series between nodes ND20 and ND21. Transfer gates T2a and T2b are closed complementarily to each other in response to drive power switch signals DRV<2> and ZDRV<2>, respectively, and thereby transmit the signal on node ND20 to node ND21.

When drive power switch signal DRV<2> is at the "H" level, clock signal CLKQ0 transmitted to node ND20 is delayed by the unit delay amount of delay unit DU2, and is transmitted to next delay adjusting unit DCU3. When drive power switch signal DRV<2> is at the "L" level, clock signal CLKQ0 transmitted to node ND20 is transmitted to next delay adjusting unit DCU3 without being delayed.

Delay adjusting unit DCU3 has a transfer gate T3a coupled between nodes ND30 and ND31 as well as delay unit DU3 and a transfer gate T3b coupled in series between nodes ND30 and ND31. Transfer gates T3a and T3b are closed complementarily to each other in response to drive power switch signals DRV<3> and ZDRV<3>, and thereby transmits the signal on node ND30 to node ND31.

When drive power switch signal DRV<3> is at the "H" level, clock signal CLKQ0 transmitted to node ND30 is delayed by the unit delay amount of delay unit DU3, and is transmitted to the output node of the clock delay adjusting circuit, which outputs the received signal as output clock signal CLKQ. When drive power switch signal DRV<3> is at the "L" level, clock signal CLKQ0 transmitted to node ND30 is transmitted to the output node without being delayed, and is output as output clock signal CLKQ.

As described above, delay adjusting units DCU0–DCU3 provide the delay amounts of corresponding delay units DU0–DU3 to clock signal CLKQ0 in accordance with drive power switch signals DRV<3:0>, respectively.

As a result, when the current drive power is low, delay adjusting unit DCUi, which is supplied with drive power switch signal DRV<i> (i: integer from 0 to 3) at the "L" level, does not delay clock signal CLKQ0 so that the delay amount of output clock signal CLKQ is small.

When the current drive power is high, delay adjusting unit DCUi, which is supplied with drive power switch signal DRV<i> at the "H" level, delays clock signal CLKQ0 so that the delay amount of output clock signal CLKQ is large.

According to the embodiment, as described above, the timing of activation of output clock signal CLKQ can be adjusted in accordance with the current drive power of the output driver transistors.

Figure 12:
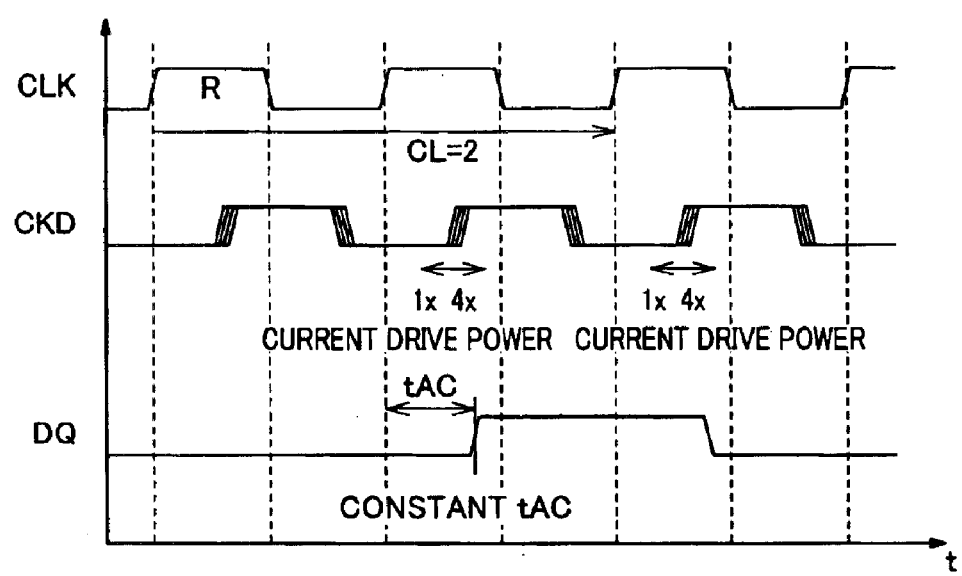
FIG. 12 illustrates operation waveforms in a data read operation of the synchronous semiconductor memory device according to the first embodiment of the invention.

FIG. 12 illustrates operation waveforms in the data read operation of synchronous semiconductor memory device 100 according to the first embodiment of the invention.

As already described, the delay amount of output clock signal CLKQ, which is produced by delaying clock signal CLK, can be adjusted in accordance with the current drive power of the output driver transistors.

Clock signal CKD determining the output timing of output data signal DQ has the delay amount, which is variable in accordance with the current drive power, owing to output clock signal CLKQ. More specifically, when the current drive power is "onefold", the smallest delay amount is achieved. When the current drive power is "fourfold", the largest delay amount is achieved.

Data output circuit 62 provides data signal DQ in response to clock signal CKD. For example, when the current drive power of the output driver transistors is "onefold", the delay occurs with respect to clock signal CKD, but adjusted clock signal CKD compensates the delay so that the shift does not occur in delay time tAC of the output timing with respect to clock signal CLK.

When the current drive power of the output driver transistors is "fourfold", clock signal CKD, of which delay amount is adjusted, adjusts the output timing to ensure delay time tAC.

As a result, the timing of activation of the output driver transistors is variable in accordance with the current drive power so that the data output timing is kept constant independently of the change in current drive power.

According to the first embodiment of the invention, as described above, when the current drive power of the output driver transistors is to be changed, the timing of activation of the output driver transistors is adjusted in accordance with the current drive power so that the output timing of the data signal can be kept constant.

Second Embodiment

According to the first embodiment already described, the shift in data output timing, which is caused by difference in magnitude of the current drive power of the output driver transistors, is compensated by adjusting the timing of activation of the output driver transistors. This manner and structure are advantageous in view of that the data output timing can be held constant independently of the current drive power of the output driver transistors.

If the output load of output data signal DQ has a magnitude corresponding to the current drive power, variations in data output timing are small. In this case, timing adjustment of output clock signal CLKQ is not required. Accordingly, a second embodiment proposes a structure, in which clock delay adjusting circuit 43A of the first embodiment additionally has a function of selecting execution and non-execution of the timing adjustment of output clock signal CLKQ.

The structure of the synchronous semiconductor memory device according to this embodiment is substantially the same as that of the first embodiment shown in FIG. 1 except for a clock delay adjusting circuit 43B, which will be describe below, and therefore description of the same portions is not repeated.

FIG. 13A shows a structure of clock delay adjusting circuit 43B included in clock buffer 40 of the synchronous semiconductor memory device according to the second embodiment of the invention.

Referring to FIG. 13A, clock delay adjusting circuit 43B includes the plurality of inverters I10–I23 coupled in series between the input and output nodes.

Inverters I10–I23 form a plurality of delay units DU each including the two inverters. Clock signal CLKQ0 provided from clock input buffer 41 (not shown in FIG. 13A) is delayed by the delay amount, which is determined by the number of active delay units DU, and is output as output clock signal CLKQ.

Clock delay adjusting circuit 43B further includes delay adjusting units DCU0–DCU3 adjusting delay amounts in delay units DU0–DU3, respectively.

Delay adjusting unit DCU0 includes transfer gate T0a coupled between nodes ND00 and ND01 as well as delay unit DU0 and transfer gate T0b coupled in series between nodes ND00 and ND01.

Transfer gates T0a and T0b are closed complementarily to each other in response to drive power switch select signals DRVL<0> and ZDRVL<0>, and thereby transmit the signal on node ND00 to node ND01. Drive power switch select signals ZDRVL<3:0> are produced by inverters (not shown) receiving drive power switch select signals DRVL<3:0>, and are complementary to signals DRVL<3:0>, respectively.

When drive power switch select signal DRVL<0> is at the "H" level, transfer gate T0b is closed to transmit the signal on node ND00 to node ND01 via delay unit DU0. When drive power switch select signal DRVL<0> is at the "L" level, transfer gate T0a is closed to transmit the signal on node ND00 to node ND01 without delaying it. Thus, when drive power switch select signal DRVL<0> is at the "H" level, clock signal CLKQ0 transmitted to node ND00 is delayed by a unit delay amount of delay unit DU0, and then is transmitted to next delay adjusting unit DCU1. When drive power switch select signal DRVL<0> is at the "L" level, clock signal CLKQ0 transmitted to node ND00 is transmitted to next delay adjusting unit DCU1 without being delayed.

Delay adjusting unit DCU1 includes transfer gate T1a coupled between nodes ND10 and ND11 as well as delay unit DU1 and transfer gate T1b coupled in series between nodes ND10 and ND11. Transfer gates T1a and T1b are closed complementarily to each other in response to drive power switch select signals DRVL<1> and ZDRVL<1>, and thereby transmit the signal on node ND10 to node ND11.

Delay adjusting unit DCU2 includes transfer gate T2a coupled between nodes ND20 and ND21 as well as delay unit DU2 and transfer gate T2b coupled in series between nodes ND20 and ND21. Transfer gates T2a and T2b are closed complementarily to each other in response to drive power switch select signals DRVL<2> and ZDRVL<2>, and thereby transmit the signal on node ND20 to node ND21.

Delay adjusting unit DCU3 includes transfer gate T3a coupled between nodes ND30 and ND31 as well as delay unit DU3 and transfer gate T3b coupled in series between nodes ND30 and ND31. Transfer gates T3a and T3b are closed complementarily to each other in response to drive power switch select signals DRVL<3> and ZDRVL<3>, and thereby transmit the signal on node ND30 to node ND31.

As described above, clock delay adjusting circuit 43B of the second embodiment has basically the same structure as clock delay adjusting circuit 43A of the first embodiment shown in FIG. 11 except for that the delay amounts of delay adjusting units DCU0–DCU3 in the first embodiment are adjusted in accordance with drive power switch signals DRV<3:0>, respectively, but the delay amounts are adjusted in accordance with drive power switch select signals DRVL<3:0> according to the second embodiment, respectively.

As described below, drive power switch select signals DRVL<3:0> are produced based on drive power switch signals DRV<3:0> and an activation signal ENB indicating necessity or non-necessity of timing adjustment of output clock signal CLKQ.

FIG. 13B shows a structure of a portion, which is arranged in clock delay adjusting circuit 43B in FIG. 13A for generating drive power switch select signals DRVL<3:0>.

Referring to FIG. 13B, the portion of generating drive power switch select signals DRVL<3:0> includes a program portion 44 nonvolatilely storing information representing whether the timing adjustment of output clock signal CLKQ is to be performed or not, a latch portion 45 holding program information stored therein, and a signal producing portion 46 producing drive power switch select signals DRVL<3:0> from the program information and drive power switch signals DRV<3:0>.

Program portion 44 is formed of a fuse element FUSE2 and a current supply S2 connected in series between power supply node Vdd and ground node GND. Current supply S2 of a low current type is employed for reducing current consumption.

When program input is not applied to fuse element FUSE2, i.e., when blowing by laser blow input is not performed, program portion 44 is turned on. When the program input is applied to fuse element FUSE2, i.e., when blowing by the laser blow input is performed, program portion 44 is nonvolatilely turned off.

When the timing adjustment of output clock signal CLKQ is to be performed, fuse element FUSE2 in program portion 44 is not blown. Thereby, program portion 44 is turned on to provide the output potential at the "L" level.

Latch portion 45 has inverters I45 and I46 each having an output node coupled to an input node of the other inverter I46 or I45, and an inverter I47 inverting the output of inverter I45 for outputting it. The potential provided from program portion 44 is held by latch portion 45, and is transmitted from the output node of inverter I47 to signal producing portion 46 as activation signal ENB. When the timing adjustment is to be performed, activation signal ENB at the "H" level is produced. When the timing adjustment is not required, activation signal ENB at the "L" level is produced.

Signal producing portion 46 has a two-input NAND circuit G46, which receives activation signal ENB on its first input node, and receives on its second input node an inverted signal of drive power switch signal DRV<3:0> issued from inverter I48.

Two-input NAND circuit G46 produces drive power switch signal DRVL<3:0> from a result of NAND of the received two signals. When activation signal ENB is at the "H" level, i.e., when the timing adjustment is to be performed, drive power switch select signals DRVL<3:0> attain the levels corresponding to drive power switch signals DRV<3:0>, respectively. When activation signal ENB is at the "L" level, i.e., when the timing adjustment is not required, drive power switch select signals DRVL<3:0> attain the levels of "H", "H", "H" and "H" independently of the logics of drive power switch signals DRV<3:0>.

Referring to FIG. 13A again, clock delay adjusting circuit 43B adjusts the delay amounts of delay adjusting units DCU according to drive power switch select signals DRVL<3:0> produced by signal producing portion 46 in FIG. 13B, respectively.

When the timing adjustment is to be performed, drive power switch select signals DRVL<3:0> are equal to drive power switch signals DRV<3:0> so that output clock signal CLKQ having the delay amount corresponding to the current drive power is produced similarly to the first embodiment.

When the timing adjustment is not required, all drive power switch select signals DRVL<3:0> attain the "H" level independently of the logics of drive power switch signals DRV<3:0> so that delay adjusting units DCU0–DCU3 do not adjust the delay amount, and output clock signal CLKQ having a constant delay amount is produced.

According to the second embodiment of the invention, as described above, the timing of activation of output clock signal CLKQ can be adjusted in accordance with the current drive power of the output driver transistors. Also, in the operation of adjusting the current drive power of the output driver transistors, it is possible to select the execution and non-execution of the timing adjustment of the output clock signal in accordance with the status of use (i.e., consistency with output load) at the product level.

Third Embodiment

Figure 14A:
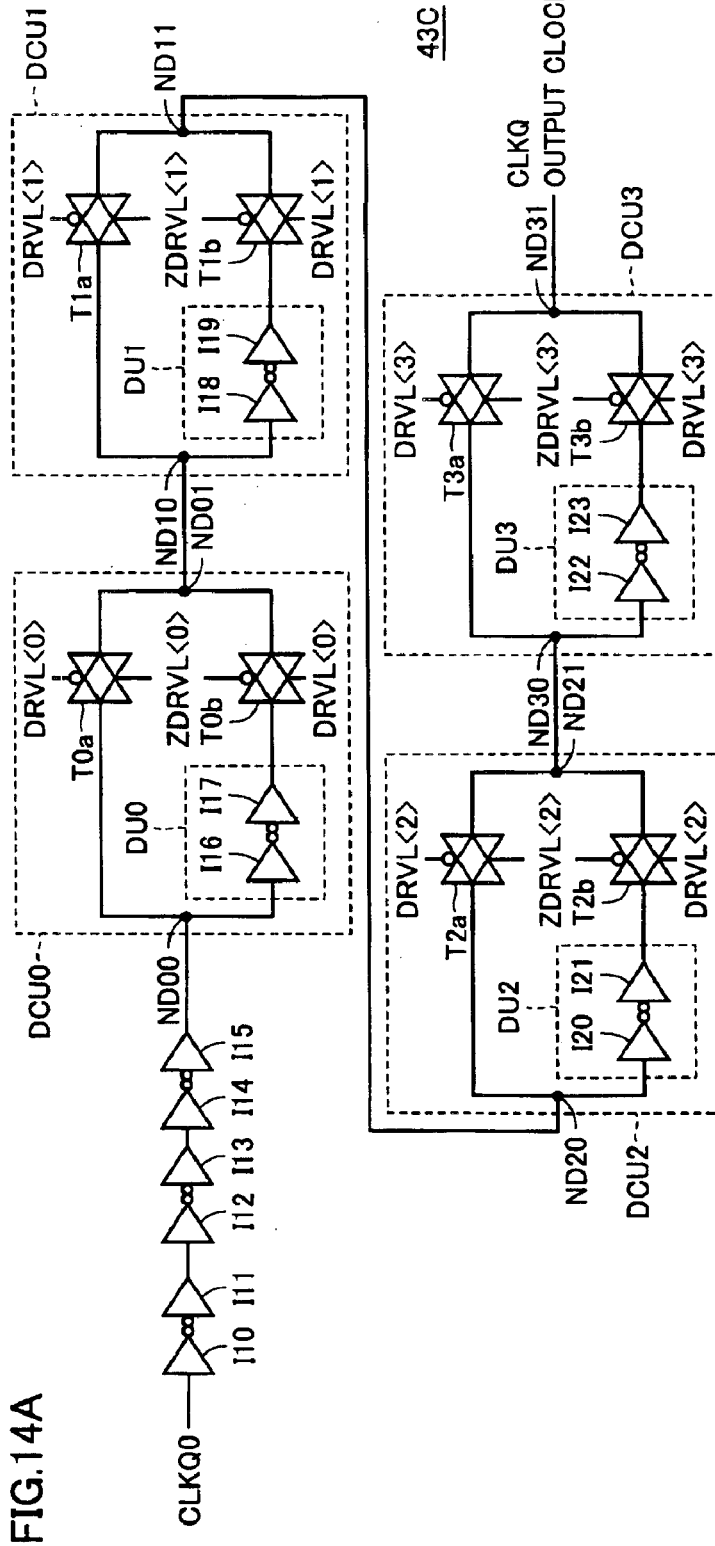
FIG. 14A shows a structure of a clock delay adjusting circuit 43C included in clock buffer 40 of a synchronous semiconductor memory device according to a third embodiment of the invention.

FIG. 14A shows a structure of a clock delay adjusting circuit 43C included in clock buffer 40 of a synchronous semiconductor memory device according to a third embodiment of the invention.

The third embodiment provides a second example of a structure related to clock delay adjusting circuit 43B of the second embodiment, which has the timing adjustment select function for output clock signal CLKQ. Similarly to the second embodiment, the circuit structures of the third embodiment other than that of clock delay adjusting circuit 43C are substantially the same as those of the first embodiment, and therefore description thereof is not repeated.

Referring to FIG. 14A, clock delay adjusting circuit 43C includes the plurality of inverters I10–I23 coupled in series between the input and output nodes.

Inverters I10–I23 form the plurality of delay units DU each including the two inverters. Clock signal CLKQ0 provided from clock input buffer 41 (not shown in FIG. 14A) is delayed by a delay amount depending on the number of delay units DU, and is output as output clock signal CLKQ.

Clock delay adjusting circuit 43C further includes delay adjusting units DCU0–DCU3 adjusting the delay amounts of delay units DU0–DU3, respectively.

Clock delay adjusting circuit 43C in this embodiment has the same structure as clock delay adjusting circuit 43B in the second embodiment already described with reference to FIG. 13A, and delay adjusting units DUC0–DUC3 adjust the delay amounts in accordance with corresponding drive power switch select signals DRVL<3:0>, respectively.

Likewise, drive power switch select signals DRVL<3:0> are produced based on drive power switch signals DRV<3:0> and activation signal ENB, which indicates the necessity and non-necessity of the timing adjustment of output clock signal CLKQ. The third embodiment provides an example of the structure of the portion generating drive power switch select signals DRVL<3:0>.

Figure 14B:
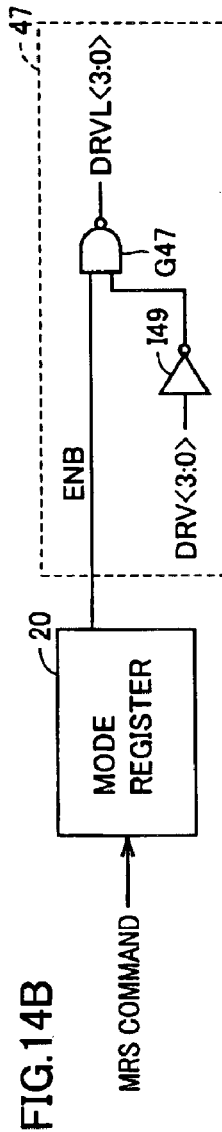
FIG. 14B shows a structure of a portion generating a drive power switch select signals DRVL<3:0>.

FIG. 14B shows a structure of the portion generating drive power switch select signals DRVL<3:0> in FIG. 14A.

Referring to FIG. 14B, the portion of generating the drive power switch select signal has mode register 20, which can change setting of the internal operation mode in accordance with mode register set command MRS externally applied to the semiconductor memory device, as well as a signal producing portion 47, which produces drive power switch select signals DRVL<3:0> based on activation signal ENB, which is stored in mode register 20 and is output therefrom in accordance with the mode setting, and drive power switch signals DRV<3:0>.

Mode register 20 stores the data specifying the operation mode in accordance with externally applied mode register set command MRS. By using mode register set command MRS, the operation of adjusting the timing of output clock signal CLKQ is selectively executed. More specifically, when mode register set command MRS selecting the timing adjusting mode is received, mode register 20 issues activation signal ENB at the "H" level. When mode register set command MRS not selecting the timing adjusting mode is received, mode register 20 issues activation signal ENB at the "L" level.

Signal producing portion 47 has a two-input NAND circuit G47, which receives activation signal ENB from mode register 20 on its first input node, and also receives, on its second input, the inverted signal of drive power switch signal DRV<3:0> provided from an inverter I49.

Two-input NAND circuit G47 produces drive power switch select signals DRVL<3:0> from a result of NAND of these two signals. When activation signal ENB is at the "H" level, i.e., when the timing adjustment is to be performed, drive power switch select signals DRVL<3:0> attain the levels corresponding to the logics of drive power switch signals DRV<3:0>, respectively. Meanwhile, when activation signal ENB is at the "L" level, i.e., when the timing adjustment is not required, drive power switch select signals DRVL<3:0> attain the logics of "H", "H", "H" and "H" independently of the logics of drive power switch signals DRV<3:0>, respectively.

Referring to FIG. 14A, clock delay adjusting circuit 43C adjusts the delay amounts of delay adjusting units DCU0–DCU3 in accordance with drive power switch select signals DRVL<3:0> produced by signal producing portion 47 in FIG. 14B, respectively.

When the timing adjustment is to be performed, drive power switch select signals DRVL<3:0> are equal to drive power switch signals DRV<3:0> so that output clock signal CLKQ having the delay amount corresponding to the current drive power is produced similarly to the first embodiment.

When the timing adjustment is not required, all drive power switch select signals DRVL<3:0> attain the "H" level independently of the logics of drive power switch signals DRV<3:0> so that delay adjusting units DCU0–DCU3 do not adjust the delay amount, and output clock signal CLKQ having a constant delay amount is produced.

According to the third embodiment, as described above, the execution and non-execution of the timing adjustment of the output clock signal can be selected in accordance with the adjustment of the current drive power of the output driver transistors, and this selection can be performed even after shipment of the products by changing the setting of the mode register before use of the product.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for performing input/output of data in synchronization with an external clock signal, comprising:

a memory cell array having a plurality of memory cells arranged in rows and columns;

a clock generating circuit generating an internal clock signal by delaying said external clock signal by a predetermined delay amount; and a data output circuit providing a data signal read from said memory cell array to an output node in synchronization with said internal clock signal, wherein said data output circuit includes:
  a plurality of first current drive portions coupled in parallel between a voltage corresponding to a first level and said output node, and each having a control node,
  a plurality of second current drive portions coupled in parallel between a voltage corresponding to a second level and said output node, and each having a control node, and
  means for producing a drive power switch signal controlling a current drive power applied to the output node at an intended level, each of said plurality of first current drive portions forms a current path between the voltage corresponding to said first level and said output node in accordance with said drive power switch signal received on the corresponding control node, each of said plurality of second current drive portions forms a current path between the voltage corresponding to said second level and said output node in accordance with said drive power switch signal received on the corresponding control node, and said clock generating circuit includes:
  a delay circuit producing said internal clock signal by delaying said external clock signal by said predetermined delay amount, and
  a delay adjusting circuit determining the delay amount of said delay circuit in accordance with said drive power switch signal.

2. The semiconductor memory device according to claim 1, wherein said delay adjusting circuit increases the delay amount of said delay circuit in accordance with said drive power switch signal instructing increase in current drive power applied to said output node, and decreases the delay amount of said delay circuit in accordance with said drive power switch signal instructing decrease in current drive power applied to said output node.

3. The semiconductor memory device according to claim 2, wherein said delay circuit includes a plurality of delay units each delaying said external clock signal by a unit delay amount in accordance with the corresponding drive power switch signal.

4. The semiconductor memory device according to claim 3, wherein said clock generating circuit further includes:

a selecting portion for nonvolatilely setting said drive power switch signal to one of valid and invalid states, and said delay adjusting circuit is disabled not to control the delay amount of said delay circuit when said selecting portion sets said drive power switch signal to the invalid state, and is enabled to control the delay amount of said delay circuit when said selecting portion sets said drive power switch signal to the valid state.

5. The semiconductor memory device according to claim 4, wherein said select portion has a program portion nonvolatilely changing from a first state to a second state in accordance with external program input, and an activation signal for setting said drive power switch signal to the valid or invalid state is produced in accordance with a state of said program portion.

6. The semiconductor memory device according to claim 4, wherein said select portion has a mode register storing a plurality of setting parameters being externally set and corresponding to a plurality of operation modes in the semiconductor memory device, respectively, and an activation signal for setting said drive power switch signal to the valid or invalid state is produced in accordance with the setting parameter stored in said mode register.

* * * * *